(12) United States Patent
Oh et al.

(10) Patent No.: US 8,045,647 B2
(45) Date of Patent: Oct. 25, 2011

(54) LOW POWER, HIGH SPEED RECEIVER CIRCUIT FOR USE IN A SEMICONDUCTOR INTEGRATED CIRCUIT

(75) Inventors: Ic Su Oh, Ichon-si (KR); Kun Woo Park, Ichon-si (KR); Yong Ju Kim, Ichon-si (KR); Hee Woong Song, Ichon-si (KR); Hyung Soo Kim, Ichon-si (KR); Tae Jin Hwang, Ichon-si (KR); Hae Rang Choi, Ichon-si (KR); Ji Wang Lee, Ichon-si (KR)

(73) Assignee: Hynix Semiconductor Inc. (KR)

( * ) Notice: Subject to any disclaimer, the term of this patent is extended or adjusted under 35 U.S.C. 154(b) by 654 days.

(21) Appl. No.: 12/170,254

(22) Filed: Jul. 9, 2008

(65) Prior Publication Data

US 2009/0116596 A1    May 7, 2009

(30) Foreign Application Priority Data

Nov. 7, 2007    (KR) .................. 10-2007-0113097

(51) Int. Cl.
H03K 9/00    (2006.01)
H04L 27/00    (2006.01)
(52) U.S. Cl. ....................... 375/316; 375/362
(58) Field of Classification Search .......... 375/257, 375/287, 293, 316–318, 354–355, 362, 340, 375/377
See application file for complete search history.

(56) References Cited

U.S. PATENT DOCUMENTS

| 6,320,818 | B1 * | 11/2001 | Matsubara | ............... 365/233.14 |
|---|---|---|---|---|
| 6,560,661 | B2 | 5/2003 | Toda et al. | |
| 7,082,048 | B2 * | 7/2006 | Choi | ............... 365/149 |
| 7,093,145 | B2 | 8/2006 | Werner et al. | |
| 7,124,221 | B1 | 10/2006 | Zerbe et al. | |
| 7,126,408 | B2 | 10/2006 | Zerbe | |
| 7,292,629 | B2 | 11/2007 | Zerbe et al. | |
| 7,505,532 | B2 * | 3/2009 | Saito et al. | ............... 375/318 |

FOREIGN PATENT DOCUMENTS

KR    1019940025185    11/1994
KR    1020030061265    7/2003
(Continued)

OTHER PUBLICATIONS

F. Bien, Y. Hur, M. Maeng, H. Kim, E. Gebara, and J. Laskar, J., "A Reconfigurable Fully-Integrated 0.18-um CMOS Feed-Forward Equalizer IC for 10-Gb/sec Backplane Links", ISCAS 2006 pp. 2117-2120.

(Continued)

*Primary Examiner* — Jean B Corrielus
(74) *Attorney, Agent, or Firm* — Baker & McKenzie LLP

(57) ABSTRACT

A receiver circuit according to the invention includes a first phase transmission unit that is synchronized with a first clock, detects input data according to a plurality of detection levels, and transmits a first output signal, a first discharging control unit that controls a second phase transmission unit in response to the first output signal and adjusts the transmission speed of the second phase transmission unit by changing a node potential where an output of the second phase transmission is determined, and the second phase transmission unit that is synchronized with a second clock, detects the input data according to an output of the first discharging control unit, and transmits a second output signal.

13 Claims, 5 Drawing Sheets

FOREIGN PATENT DOCUMENTS

KR 1020070014242 2/2007

OTHER PUBLICATIONS

James E. Jaussi, Ganesh Balamurugan, David R. Johnson, Bryan Casper, Aaron Martin, Joseph Kennedy, Naresh Shanbhag, and Randy Mooney, "8-Gb/s Source-Synchronous I/O Link With Adaptive Receiver Equalization, Offset Cancellation, and Clock De-Skew", IEEE Journal of Solid-State Circuits, Jan. 2005, pp. 80-88, vol. 40, No. 1.

* cited by examiner single_ended signaling

Differental signaling

LOW POWER, HIGH SPEED RECEIVER CIRCUIT FOR USE IN A SEMICONDUCTOR INTEGRATED CIRCUIT

CROSS-REFERENCES TO RELATED APPLICATION

The present application claims priority under 35 U.S.C. 119(a) of Korean application number 10-2007-0113097, filed on Nov. 7, 2007, in the Korean Intellectual Property Office, the disclosure of which is incorporated herein in its entirety by reference, as if set forth in full.

BACKGROUND

1. Technical Field

The embodiments herein relate to a semiconductor integrated circuit, and more particularly to a receiver circuit that can be used in a semiconductor integrated circuit to increase operational speed and integration.

2. Related Art

The increasing processing speed of modern computers has increasingly required low-power, high-speed semiconductor integrated circuits. Due to this trend, in recent years, a multi level or a multi bit technology that achieves high storage density has been used as an information transmission technology between a semiconductor integrated circuit and a broader system. Multi level technology represents data using a plurality of signal levels and bits, instead of represented binary information using two levels, i.e., high and low.

For example, unlike conventional memory circuits in which unit cell that stores only high-level or low-level information, a unit cell in a multi level memory circuit can store data using four voltages or more.

However, conventional multi-level technology requires large amounts of power and can produce errors due to signal distortion during a high-speed operation.

A conventional receiver circuit acts as the interface circuit between the broader system and the particular integrated circuit. The receiver circuit is responsible for receiving signals to be input to the integrated circuit, buffering them, and then forwarding them to internal portions of the circuit. The receiver should transmit the signals to the internal circuits without generating additional signal distortion. Therefore, equalization is often used to ensure adequate signal margin and/or to compensate for signal attenuation losses.

In relation to the above, related technologies have been disclosed in "A Reconfigurable Fully-Integrated 0.18-gm CMOS Feed Forward Equalizer IC for 10-Gb/sec Back Plane Links" (ISCAS 2006), in which a Feed-Forward Equalization (FFE) architecture is described, and "8-Gb/s Source-Synchronous I/O Link With Adaptive Receiver Equalization, Offset Cancellation, and Clock De-Skew" (IEEE JSSC Vo. 40), in which a Decision Feedback Equalization (DFE) is described. However, such implementations are complicated and require a large circuit area. Additionally, FFE implementations tend to amplify signal noise in addition to the data information, which can be problematic.

SUMMARY

A receiver circuit that requires a relatively small circuit area and has an improved sensing speed is described herein.

According to one aspect, a receiver circuit can include a first phase transmission unit that can be synchronized with a first clock, detect input data according to a plurality of threshold detection levels, and transmit a first output signal, a second phase transmission unit coupled with the first phase transmission unit, the second phase transmission unit synchronized with a second clock and configured to detect the input data according to an output of the first discharging control unit, and transmits a second output signal; and a first discharging control unit coupled with the second phase transmission unit, the discharge control unit configured to control the second phase transmission unit in response to the first output signal and adjust the transmission speed of the second phase transmission unit by changing a node potential where an output of the second phase transmission is determined.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

According to the embodiments described herein, a receiver circuit can achieve equalization in a simple configuration without using a complicated circuit, such that the required area and power can be reduced while improving noise characteristics. For example, the embodiments described herein can have improved noise characteristics, as compared with conventional FFEs, and can have less complicated configuration, as compared with conventional DFEs.

Figure 1:
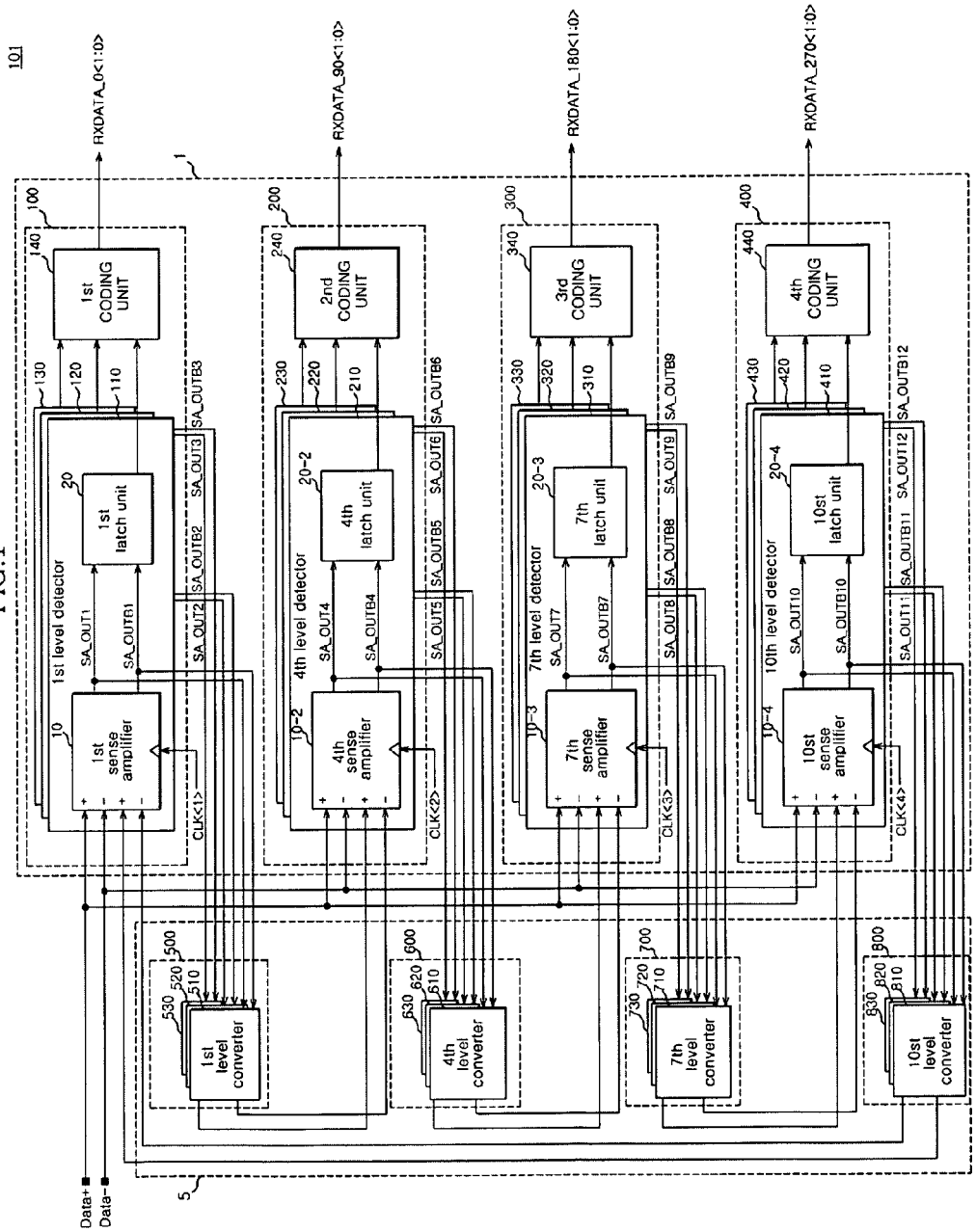
FIG. 1 is a block diagram of a receiver circuit according to one embodiment described herein.

FIG. 1 is a block diagram of a receiver circuit 101 according to one embodiment described herein. The receiver circuit 101 can include a phase transmission block 1 and a discharging block 5. In the embodiments described herein receiver circuit 101 can operates in a 4-phase mode and receive a 4-multi bit data signals. It will be understood, however, that the embodiments described herein are not limited thereto.

As can be seen, phase transmission block 1 receives differential, 1-bit data signals "Data+" and "Data−". An interval or time in which the received 1-bit data signals "Data+" and "Data−" are effective is defined as a unit interval (hereafter, referred to as 'UI'). It is exemplified herein that the cycle of each clock phase that supports the 4-phase mode is 4UI and the phase difference of each clock phase is 1UI.

The phase transmission block 1 can include first to fourth phase transmission units 100 to 400 and the discharging block 5 can include first to fourth discharging control units 500 to 800 that can correspond to and be coupled with the first to fourth phase transmission units 100 to 400.

The first to fourth phase transmission unit 100 to 400 can be configured to detect the input data signals "Data+" and "Data−" in synchronization with each clock signal "CALK<1>" to "CLK<4>". The clock signals "CLK<4>" can maintain a phase difference of 90°. That is, it may be said that the clocks that synchronize the phase transmission units 100 to 400 maintain a phase difference of 1UI. Therefore, the phase transmission units 100 to 400 should sense data in 1UI differences.

According to an embodiment described herein, the first to fourth phase transmission units 100 to 400 can provide first to fourth phase output signals "RXDATA_0<1:0>", "RXDATA_90<1:0>", "RXDATA_180<1:0>", "RXDATA_270<1:0>", while adjusting a sensing speed by controlling the first to fourth discharging control units 500 to 800.

The first phase transmission unit 100 can be synchronized with the first clock signal "CLK<1>", detect the input data "Data+" and "Data−" according to a plurality of detection levels, and provide the first phase output signal "RXDATA_0<1:0>". The first phase transmission unit 100 can include first to third level detecting units 110 to 130 and a first coding unit 140. The detailed configuration and operation of the first phase transmission unit 100 is described below with reference to FIG. 2.

The first phase unit 100 can detect the level of the input data signals "Data+" and "Data−" in response to an output signal "OFF" and "OFFb" of the fourth discharging control unit 800. The fourth discharging control unit 800 can receive output signals of the sense amplifier of the fourth phase transmission unit 400 that can transmits the final phase (e.g. "SA_OUT10", "SA_OUTB10", . . . ) of four phases and can adjust the sensing speed of the first phase transmission unit 100 by changing the node potential of the first phase transmission unit 100.

In detail, the fourth discharging control unit 800 can increase the data sensing speed of the first phase transmission unit 100 when the data patterns of the input data signal "Data+" and "Data−", received when the fourth clock signal "CLK<4>" is enabled, are different from the data patterns of the input data signals "Data+" and "Data−", received when the first clock signal "CLK<1>" is enabled.

Further, the fourth discharging control unit 800 does not change the data sensing speed of the first phase transmission unit 100 when the data patterns of the input data signals "Data+" and "Data−", received when the fourth clock signal "CLK<4>" is enabled, are the same as the data patterns of the input data signals "Data+" and "Data−", received when the first clock signal "CLK<1>" is enabled.

Accordingly, since the data sensing speed of the phase transmission units can be controlled by each discharging control unit via an offset signal provided to the phase transmission units, each phase transmission unit can have a sufficient sensing margin. The input signals "Data+" and "Data−" can generally be received by the receiver circuit through a channel. The input data "Data+" and "Data−" can be transmitted with a pair of positive and negative signs, and can be classified into, e.g., four states, for example, 00, 01, 10, and 11, depending on the voltage difference of the input data signals "Data+" and "Data−".

Thus, such a differential signal scheme can be used to decode the input data signals "Data+" and "Data−" using the magnitude of the voltage difference of the input data signals "Data+" and "Data−". For example, when the data is divided into, e.g., four intervals, the smallest magnitude difference between the differential input signals "Data+" and "Data−" can indicate the data '00' and the largest magnitude difference can indicate the data '11'.

The second phase transmission unit 200 can be synchronized with the second clock signal "CLK<2>" can detect the input data signals "Data+" and "Data−" according to an output of the first discharging control unit 500, and can provide a second phase output signal "RXDATA_90<1:0>". The second phase transmission unit 200 can include fourth to sixth level detecting units 210 to 230 and a second coding unit 240. The first discharging control unit 500 can be controlled by the output signals "SA_OUT1" and "SA_OUTB1" of the sense amplifiers of the first phase transmission unit 100 and can adjust the transmission speed of the second phase transmission unit 200 by changing the node potential of the second phase transmission unit 200.

The third and fourth phase transmission units 300 and 400 and the second and third discharging control units 600 and 700 can operate in a manner similar to the first and second phase transmission units 100 and 200 and the fourth and first discharging control units 800 and 500 described above.

The third phase transmission unit 300 can be synchronized with the third clock signal "CLK<3>", can detect the input data signals "Data+" and "Data−" according to an output of the second discharging control unit 600, and can provide the third phase output signal "RXDATA_180<1:0>". The third phase transmission unit 300 can include seventh to ninth level detecting unit 310 to 330 and a third coding unit 340.

The fourth phase transmission unit 400 can be synchronized with the fourth clock signal "CLK<4>", can detect the input data signals "Data+" and "Data−" according to an output of the third discharging control unit 700, and transmit the fourth phase output signal "RXDATA_270<1:0>".

The fourth phase transmission unit 400 can include tenth to twelfth level detecting units 410 to 430 and a fourth coding unit 440.

The first discharging control unit 500 can be configured to adjust the transmission speed of the second phase transmission unit 200 by changing the node potential of the second phase transmission unit 200 according to the first output signals "SA_OUT1" and "SA_OUTB1".

Referring again to FIG. 2, the first phase transmission unit 100 can detect the magnitudes of the input data signals "Data+" and "Data−" using each level detecting unit, in which the offset voltage of each of the level detecting units can be determined by the sensed voltage of the prior phase transmission unit. As described above, the magnitudes of the input data signals "Data+" and "Data−", relative to a predetermined reference, are information such that it is important for the first phase transmission unit 100 to accurately detect and transmit a fine voltage with exact timing.

The first phase transmission unit 100 can include a first level detecting unit 110, a second level detecting unit 120, a third level detecting unit 130, and a first coding unit 140. The first to third level detecting unit 110, 120, and 130 can provide the plural detection levels for generating the first output signals 'SA_OUT1'/'SA_OUTB1', 'SA_OUT2'/'SA_OUTB2', and 'SA_OUT3'/'SA_OUTB3'. Each of the level detecting units 110 to 130 can have a sense amplifier configured to accurately detect fine voltages of the input data signals "Data+" and "Data−".

The first level detecting unit 110 can output first detection signals "SA_OUT1" and "SA_OUTB1" that can detect whether the magnitude difference in the data signals "Data+" and "Data−" exceeds a first threshold level. The second level detecting unit 120 can output second detection signals "SA_OUT2" and "SA_OUTB2" that can detect whether the magnitude difference of the input data signals "Data+" and "Data−". Exceeds a second threshold level. The third level detecting unit 130 can output third detection signals "SA_OUT3" and "SA_OUTB3" that can detect whether the magnitude difference of the input data signals "Data+" and "Data−" exceeds a third threshold level.

Depending on the embodiment, the first threshold level can be higher than the second threshold level, and the second threshold level can be higher than the third threshold level.

Therefore, the first level detecting unit 110 can detect and amplify a signal difference above the first threshold level in the input data signals "Data+" and "Data−" according to first offset voltages "off<1>" and "offb<1>" and can output the first detecting signals "SA_OUT1" and "SA_OUTB1". The first offset voltages "off<1>" and "offb<1>" can be the outputs of a tenth capacitor unit 810, which can be included in the fourth discharging control unit 800 and can result from the operation of the sense amplifier of the fourth phase transmission unit 400. Therefore, the control of the sensing speed of the first phase transmission unit 100 can depends on the sensing result of the fourth phase transmission unit 400, which can result in an increase in the sensing speed when the data pattern at the corresponding data input state is different from that of the prior state.

The first level detecting unit 110 can include a first sense amplifier 10 and a first latch 20. The first sense amplifier 10 can detect and amplify a signal difference in the input data signals "Data+" and "Data−" above the first threshold level. The first latch 20 can receive the first detection signals "SA_OUT1" and "SA_OUTB1", and can latch and transmit the first detection signals to the first coding unit 140.

The second level detecting unit 120 can detect and amplify a signal difference of the input data signals "Data+" and "Data−" above the second threshold level, according to second offset voltages "off<2>" and "offb<2>", and can output a second detection signals "SA_OUT2" and "SA_OUTB2". The second offset voltages "off<2>" and "offb<2>" can be outputs of the eleventh capacitor unit 820 and the second detection signals can be sent to the second capacitor unit 520.

The second level detecting unit 120 can include a second sense amplifier 30 and a second latch 40. The second sense amplifier 30 can detect and amplify a signal difference in the input data signals "Data+" and "Data−" above the second threshold level. The second latch 40 can receive the second detection signals "SA_OUT2" and "SA_OUTB2", and can latch and transmit the second detecting signals to the first coding unit 140.

The third level detecting unit 130 can detect and amplify a signal difference in the input data signals "Data+" and "Data−" above the third threshold level according to third offset "off<3>" and "offb<3>", and can output third detection signals "SA_OUT3" and "SA_OUTB3". The third offset voltages "off<3>" and "offb<3>" can be outputs of the twelfth capacitor unit 830 and the third detection signals "SA_OUT3" and "SA_OUTB3" can be sent to the third capacitor unit 530.

The third level detecting unit 130 can include a third sense amplifier 50 and a third latch 60. The third sense amplifier 50 can detect and amplify a signal difference in the input data signals "Data+" and "Data−" above the third threshold level. The third latch 60 can receive the third detection signals "SA_OUT3" and "SA_OUTB3", and can latch and transmit the third detection signals to the first coding unit 140.

The first coding unit 140 can receive and code the output of the first level detecting unit 110, the output of the second level detecting unit 120, the output of the third level detecting unit 130, and output the first phase output signal "RXDAT_0<1:0>" based thereon.

The operation of the first phase transmission unit 100 shown in FIG. 2 will now be described in detail. The first to third sense amplifiers 10, 30, and 50 can be activated in synchronization with the first clock signal "CLK<1>", receive the data signals "Data+" and "Data−", and output high-level signals when detecting that the magnitude difference in the data signals is above corresponding reference voltage levels, i.e. the first threshold level, second threshold level, and third threshold level, respectively, or can output low-level signals when detecting that the magnitude difference in the data signals is less than the reference voltage levels. The first to third latches 20, 40, and 60 can latch the outputs of the first to third sense amplifier 10, 30, and 50, respectively, and can output them to the coding unit 140.

The first coding unit 140 can be configured to code each received value and provide the magnitude difference of the input data signals "Data+" and "Data−" as the first phase output signal "RXDATA_0<1:0>". For example, when the input data signals "Data+" and "Data−" have a potential difference that exceeds the first threshold level, then the first level detecting unit 110 can output high-level first detection signals "SA_OUT1" and "SA_OUTB1", the second level detecting unit 120 can output high-level detection signals "SA_OUT2" and "SA_OUTB2", and the third level detecting unit 130 can also output high-level third detection signals "SA_OUT3" and "SA_OUTB3". The first to third signals "SA_OUT1" and "SA_OUTB1", . . . can be transmitted to the first coding unit 140.

When the input data signals "Data+" and "Data−" have a potential difference lower than the first threshold level and higher than the second threshold level, then the first level detecting unit 110 can output low-level first detection signals "SA_OUT1" and "SA_OUTB1", the second level detecting unit 120 can output high-level second detection signals "SA_OUT2" and "SA_OUTB2", and the third level detecting unit 130 can outputs high-level third detection signals "SA_OUT3" and "SA_OUTB3". The first to third detection signals "SA_OUT1" and "SA_OUTB1", . . . can be transmitted to the first coding unit 140.

When the input data signals "Data+" and "Data−" have a potential lower than the second threshold level and higher than the third threshold level, then the first level detecting unit 110 can output low-level first detection signals "SA_OUT1" and "SA_OUTB1", the second level detecting unit 120 can also output low-level second detection signals "SA_OUT2" and "SA_OUTB2", and the third level detecting unit 130 can output high-level third detection signals "SA_OUT3" and "SA_OUTB3". The first to third detection signals "SA_OUT1" and "SA_OUTB1", . . . can be transmitted to the first coding unit 140.

When the input data signal "Data+" and "Data−" have a potential difference that is lower than the third threshold level, the first level detecting unit 110 can output low-level first detection signals "SA_OUT1" and "SA_OUTB1", the second level detecting unit 120 can output low-level second detection signals "SA_OUT2" and "SA_OUTB2", and the third level detecting unit 130 can also output low-level third detection signals "SA_OUT3" and "SA_OUTB3". The first to third detection signals "SA_OUT1" and "SA_OUTB1", . . . can be transmitted to the first coding unit 140. The first coding unit 140 can code the received signals and transmit the encoded data as the first phase output signal "RXDATA_0<1:0>".

Figure 2:
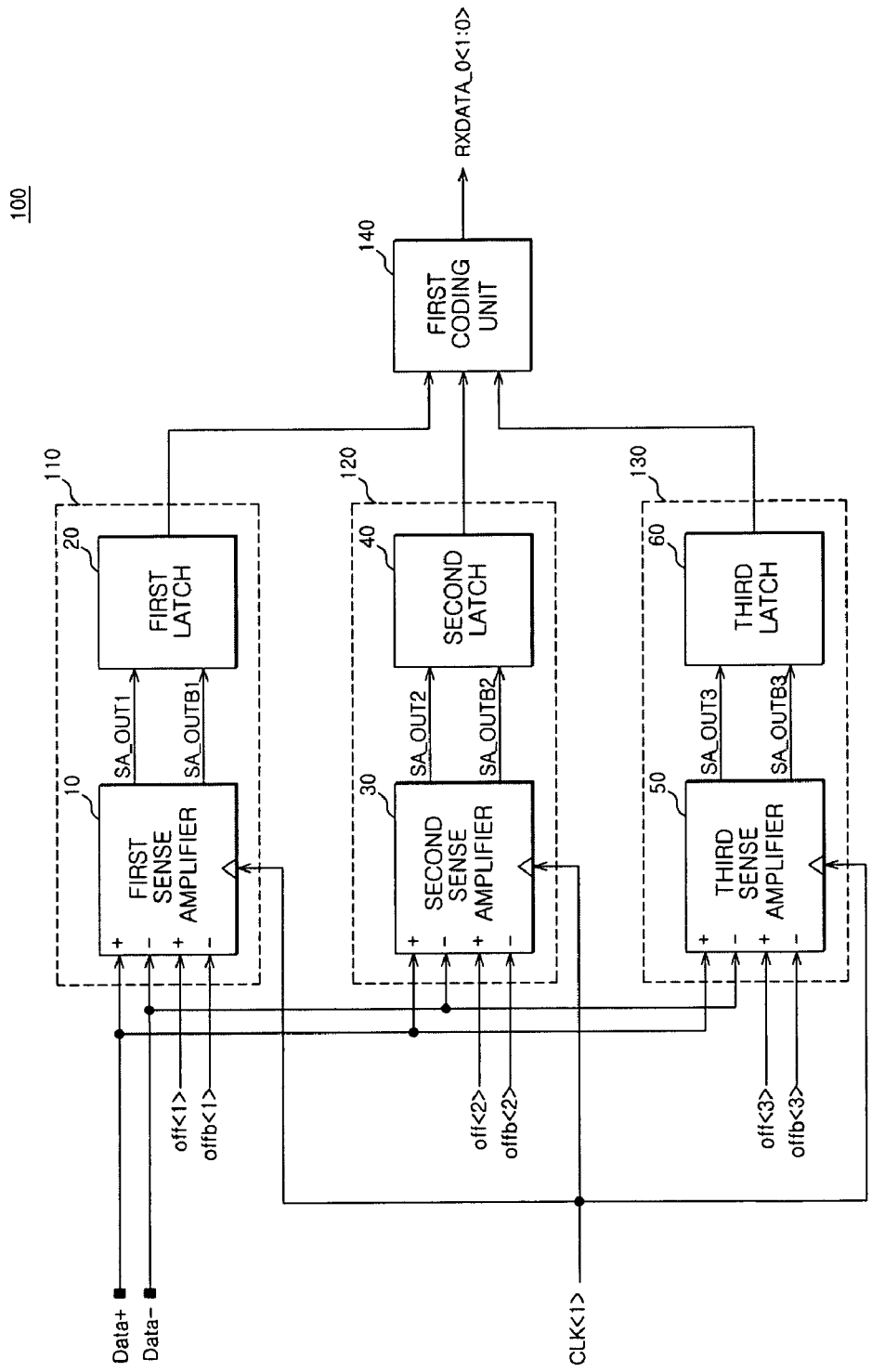
FIG. 2 is a detailed circuit diagram of a first phase transmitting unit that can be included in the circuit illustrated in FIG. 1.
Figure 3:
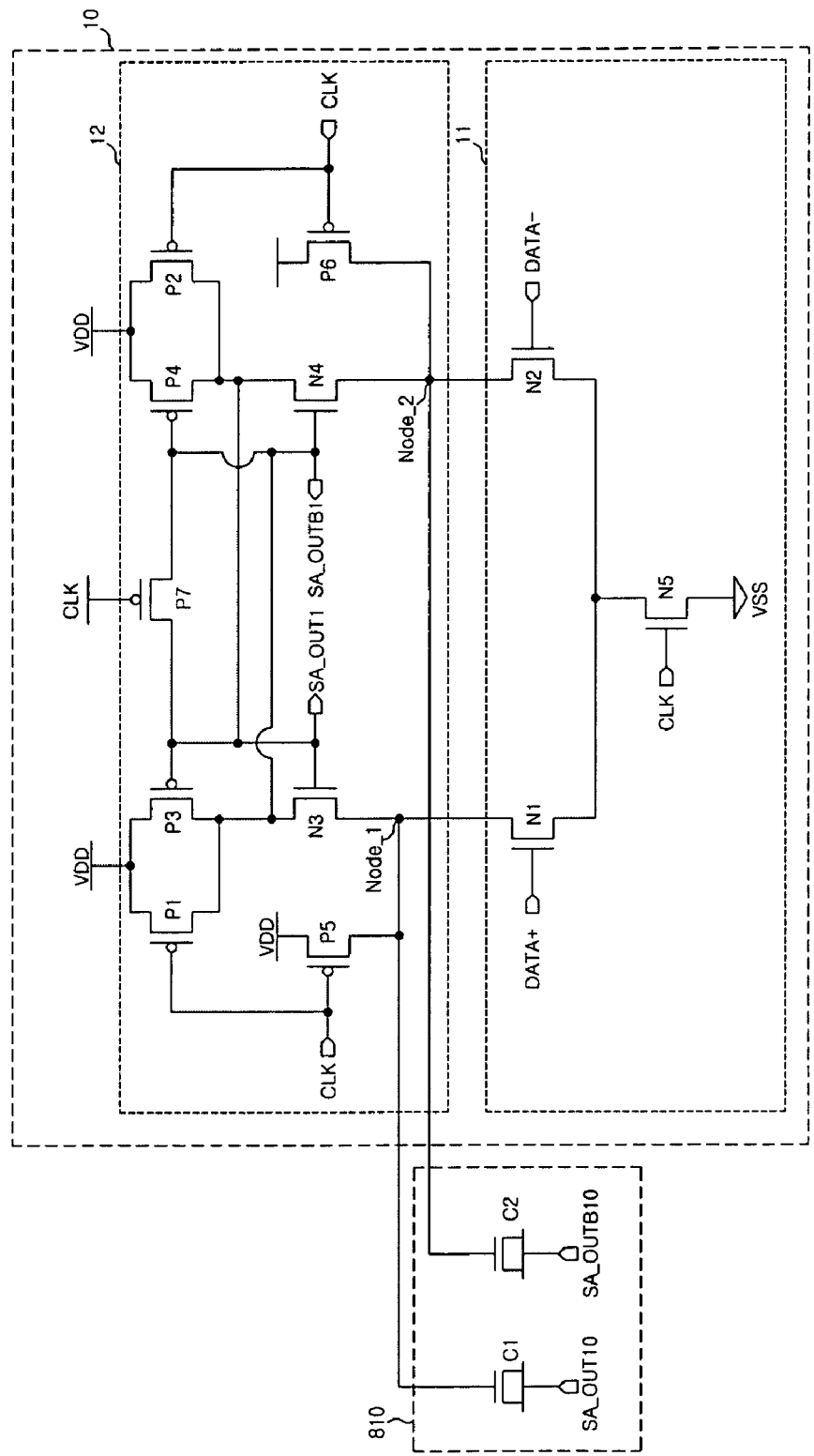
FIG. 3 is a detailed circuit diagram of a tenth capacitor unit and a first sense amplifier that can be included in the circuit illustrated in FIG. 1.

FIG. 3 is a detailed circuit diagram of the first sense amplifier 10 and the tenth capacitor unit 810 that can be included in the circuit illustrated in FIG. 2. The first sense amplifier 10 can be configured to amplify the input data signals "Data+" and "Data−" in synchronization with the clock signal "CLK". The sense amplifier 10 can include an input comparing part 11 and an amplifying part 12.

The input comparing part 11 can receive the input data signals "Data+" and "Data−" and adjust the potentials of a first node Node_1 and a second node Node_2. The input comparing part 11 can be achieved by first and second NMOS transistors N1, N2 and a fifth NMOS transistor N5. The amplifying part 12 can amplify the first detection signals "SA_OUT1" and "SA_OUTB1" according to the potentials of the first node Node_1, and the second node Node_2. The amplifying part 12 can be achieved through third and fourth NMOS transistors N3, N4, third and fourth PMOS transistors P3, P4, first and second PMOS transistors P1, P2, and fifth to seventh PMOS transistors P5 to P7.

Further, the tenth capacitor unit 810 can be configured to receive the outputs "SA_OUT10" and "SA_OUTB10" of the tenth level detecting unit 410 and be connected with the first sense amplifier 10 in the first level detecting unit 110. The tenth capacitor unit 810 can be achieved by a MOS capacitor C1 and a MOS capacitor C2. The MOS capacitor C1 can have a gate connected with the first node Node_1, and a drain and source connected with the output "SA_OUT10" of the tenth level detecting unit 410. Further, the MOS capacitor C2 can have a gate connected with the second node Node_2, and a drain and a source connected with the output "SA_OUTB1-" of the tenth level detecting unit 410.

It can be important for the first sense amplifier 10 to provide the first detection signals "SA_OUT1" and "SA_OUTB1" to the first capacitor unit 510 in order to provide the offset potential of the fourth detecting unit 210. The reason for this is to control the sensing speed, as described above when the data patterns are different at the prior phase transmission unit and the next phase transmission unit. The configurations of the second to twelfth sense amplifiers can be the same as the configuration of the first sense amplifier 10 shown in FIG. 3, except for the output, clock signal, and output signal of the receiving capacitor unit. Accordingly, they will not be described in detail here for the sake of brevity. Further, configurations of the first to ninth capacitor units, the eleventh capacitor unit, and the twelfth capacitor unit can also be achieved by MOS capacitors, similar to the tenth capacitor unit 810. The operations of the first sense amplifier 10 and the tenth capacitor unit 810 shown in FIG. 3 will now be described in detail.

As the clock signal "CLK" goes low, the first PMOS transistor P1 and the second PMOS transistor P2 can be turned on and the first detection signals "SA_OUT1" and "SA_OUTB1" can go to a high level. Therefore, the third and fourth NMOS transistors N3 and N4 can be turned on and the first and second nodes Node_1 and Node_2 can be precharged to a high level.

As the clock signal "CLK" transitions to a high level, the fifth NMOS transistor N5 can be turned on and a current path of the first sense amplifier 10 can be formed and allowing amplification of the first detection signals "SA_OUT1" and "SA_OUTB1" according to the magnitudes of the input data signals "Data+" and "Data-". That is, the first detection signals "SA_OUT1" and "SA_OUTB1" can be provided during the interval when the clock signal "CLK" is enabled, or high.

When the input data "Data+" and "Data-" are at a high level and a low level respectively, the first NMOS transistor N1 can be turned on, the potential of the first node Node_1 can become a low level, and the potential of the second node Node_2 can become a high level. Therefore, the gate-source voltage difference of the third NMOS transistor N3 can be larger than the gate-source voltage difference of the fourth NMOS transistor N4, such that the first detection signals "SA_OUT1" and "SA_OUTB1" can become high and low levels respectively, based on the voltage differences of the input data signals "Data+" and "Data-".

However, the first sense amplifier 10, according to the embodiments described herein, can quickly detect the potentials of the first node Node_1 and the second node Node_2, using the outputs "SA_OUT10" and "SA_OUTB10" of the tenth level detecting unit 410 as offset voltages. For example, assuming that the outputs "SA_OUT10" and "SA_OUTB10" of the tenth level detecting unit 410 are at a high and low level respectively, and the input data signals "Data+" and "Data-" are at a high and low level respectively, that is, when the data patterns are the same as in the prior phase transmission unit then the first node Node_1 and the second node Node_2 are precharged to a high level and both ends of the MOS capacitor C1 at high levels, such that the sense amplifier 10 is not affected by the voltage on capacitor C1.

On the other hand, the gate end of the MOS capacitor C2 is at a high level and the drain and the source end are at low level, such that the operation of the capacitor affects the sensing of the sense amplifier 10. Therefore, when the first sense amp 10 is activated, the potential of the first node Node_1 is not affected by the MOS capacitor C1 and can be discharged to become a low level by the high-level input data signal "Data+". However, the potential of the second node Node_2 can maintain the high-level pre-charge potential due to the effect of the voltage on the MOS capacitor C2. Accordingly, when the data patterns are the same, the sensing speed does not change.

However, when the output of the tenth level detecting unit 410 in the fourth phase transmission unit 400 is different from the input data of the first phase transmission unit 100, for instance, when the outputs "SA_OUT10" and "SA_OUTB10" of the tenth level detecting unit 410, in the fourth phase transmission unit 400, are at a high and low level respectively, then only the MOS capacitor C1 affects the first sense amplifier 10. Therefore, the potential of the first node Node_1 can be changed due to the capacitor loading effect of the MOS capacitor C1. The potential of the second node Node_2 can be determined by the input data signal "Data-", regardless of the voltage on MOS capacitor C2.

Accordingly, when the data patterns are different at the prior phase transmission unit, it is possible to increase the sensing speed using an offset potential to secure the sensing margin. That is, the sense amplifier 112 can more quickly amplify the potential difference between the first node Node_1 and the second node Node_2, due to the offset voltages applied to Node_1 and Node_2.

On the other hand, for example, the input data signals "Data+" and "Data-" can be low-voltage differential signals like CML (Current-Mode Logic) signals. Therefore, for the purpose of ease of description, it is assumed for the embodiments described herein that the input data signals "Data+" and "Data-" are CML signals although the actual signaling levels can depend on the requirements of a particular implementation. Since the input data signal "Data-" can have a low level which is, e.g., a low CML level, the second NMOS transistor is not completely turned off. Therefore, the second node Node_2 can be gradually discharged from a high level to a low level. At this time, a load can occur by the MOS transistor C2, and accordingly, the second node Node_2 can be gradually discharged (unlike conventional circuits). As a result, the timing of when a differential voltage between the input data signals "Data+" and "Data-" becomes a predetermined value is earlier than in a conventional circuit.

As described above, if the data pattern is changed (if the levels of the input data are changed), the loading effect of the capacitor appears. As a result, the timing of when the predetermined differential voltage is generated can be earlier, resulting in a sufficient sensing margin.

The operation of the receiver circuit according to an embodiment described herein is described hereafter with reference to FIGS. 1 to 3.

First, as shown in FIG. 1, it assumed that the receiver circuit operates in response to four clock signals, each having a different phase. That is, the first to fourth clock signals "CLK<1:4>" have corresponding phases of 0°, 90°, 180°, and 270° relative to first clock signal "CLK<1>". Further, it is assumed that the input data signal "Data+" received by the receiver circuit has the following pattern: 11010000.

The first to twelfth sense amplifiers can be enabled for 2UI of the first to fourth clock signals "CLK<1:4>" and can be disabled for 2UI of the first to fourth clock signals "CLK<1:4>". The first to twelfth amplifiers can also perform sensing and amplifying and maintain the signals for 2UI while they are enabled. Further, the first to twelfth capacitor units can be achieved by NMOS capacitors, similar to the configuration of the tenth capacitor unit 810 shown in FIG. 3.

Further, the first to fourth phase transmission units 100 to 400 can detect the magnitude difference of input data signals "Data+" and "Data−" at a plurality of levels (the first, second, and third threshold levels), each using the first to third level detecting unit 110, 120, and 130, the fourth to sixth level detecting unit 210, 220, and 230, the seventh to ninth detecting units 310, 320, and 330, and the tenth to twelfth level detecting units 410, 420, and 430. For the convenience of description, the case where the input data signals "Data+" and "Data−" are detected at the first threshold level according to the first to fourth clocks "CLK<1:4>" is described. Therefore, the operations of the first, fourth, seventh, and tenth level detecting units 110, 210, 310, and 410, and the first, fourth, seventh, and tenth capacitor units 510, 610, 710, and 810 are described hereafter.

When the first clock signal "CLK<1>" is enabled, the first sense amplifier 10 can detect and amplify the magnitude difference in the input data signals "Data+" and "Data−", e.g., which can be at a high level and a low level respectively, and can then output high- and low-level first detection signals "SA_OUT1" and "SA_OUTB1". The high- and low-level outputs "SA_OUT1" and "SA_OUTB1" of the first sense amplifier 10 can be received as the offset potential of the next phase transmission unit, that is, at the high and low level to the first capacitor unit 510. Therefore, the first MOS capacitor C1 of the first capacitor unit (assuming that it has the same configuration as the tenth capacitor unit) can receive the high level and the second MOS capacitor can receive the low level.

Thereafter, the second clock "CLK<2>" can be enabled, and the fourth sense amplifier (assuming that it has the same configuration of the first sense amplifier) can receive high- and low-level input data signals "Data+" and "Data−", in which the input data signals "Data+" and "Data−" can have the same levels as the input data signals "Data+" and "Data−" when the first clock "CLK<1>" is enabled. Since, the data signal "Data+" is at a high level, the first NMOS transistor N1 can be turned on, the potential of the first node Node_1 can go to a low level. Further, since the data signal "Data−" is at a low level, the second NMOS transistor N2 can be turned off.

Further, the second capacitor C2 of the first capacitor unit 510 store a low level, the potential of the second node Node_2 can be gradually decreased from a high level; however, the second NMOS transistor N2 can be turned off, such that the change of potential of the second node Node_2 by the second capacitor C2 can be very small. Therefore, when the data is not different from the prior input data signals "Data+" and "Data−", the data sensing speed does not change. The fourth sense amplifier can output high- and low-level fourth detection signals "SA_OUT4" and "SA_OUTB4".

The high- and low-level outputs "SA_OUT4" and "SA_OUTB4" of fourth sense amplifier can be received by the fourth capacitor unit 410. Therefore, the first MOS capacitor C1 of the fourth capacitor unit (assuming that it has the same configuration as the tenth capacitor unit) can receive the high level output and the second MOS capacitor C2 can receive the low level output.

Thereafter, the third clock "CLK<3>" can be enabled and the seventh sense amplifier (assuming that it has the same configuration as the first sense amplifier) can receive the low- and high-level input data signals "Data+" and "Data−", in which the input data signals "Data+" and "Data−" can have different levels from the input data signals "Data+" and "Data−" when the first clock "CLK<2>" is enabled. Since the data signal "Data+" is at a low level, the first NMOS transistor N1 can be turned off, and since the data signal "Data−" is at a high level, the second NMOS transistor N2 can be turned on, such that the potential of the second node Node_2 can go to a low level. Further, the second capacitor C2 of the fourth capacitor unit 610 stores a low level, the potential of the second node Node_2 can be more quickly discharged. Therefore, because the operating speed of the seventh sense amplifier increases, when input data having different patterns from the prior input data signal "Data+" and "Data−" is received, the data can be more quickly transmitted by the increase of the operating speed of the seventh sense amplifier.

Figure 4A:
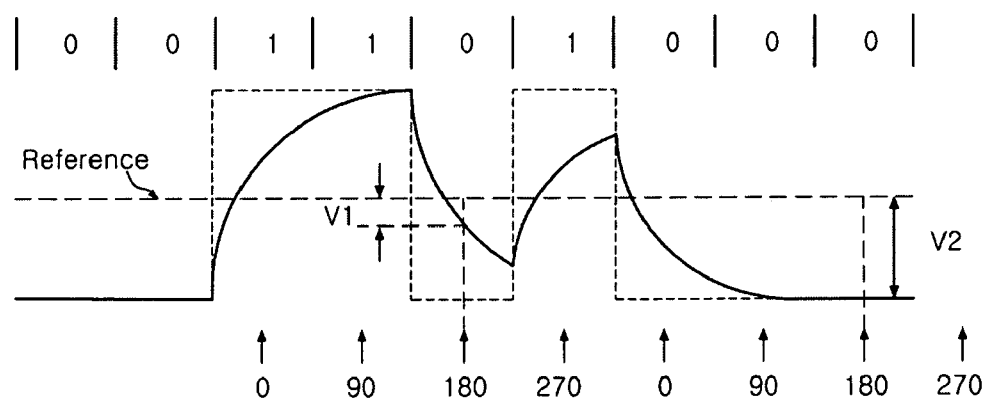
FIGS. 4A and 4B are waveform diagrams showing the operation of the receiver circuit in FIG. 1.

Accordingly, the operating speed of the sense amplifier does not substantially change when the patterns of the prior input data are the same as those of the corresponding input data; however, when the patterns of the input data are different, it is possible to decrease data distortion at a high speed during data transmission by increasing the operating speed of the sense amplifier. Thus, it can be seen that the detection reference voltage margin V1 of the receiver circuit according to the invention shown in FIG. 4B can increase as compared with the reference voltage margin V1 according to the related art shown in FIG. 4A.

Therefore, it is possible to effectively achieve high-level/low-level detecting of each sense amplifier using loading effect of the capacitor. That is, as show in FIG. 4B, a detection reference voltage potential (offset controlled Reference), which is not a fixed reference and changed by an offset voltage, appears, such that it is possible to decrease distortion during signal transmission.

Figure 4B:
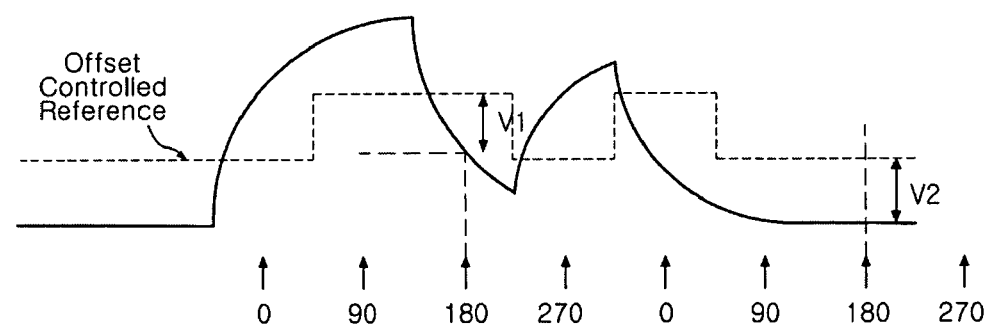

As shown in the timing diagram of the receiver according to the invention shown in FIG. 4B, the potential of the detecting reference voltage can increase and decrease according to the level of an output data by the prior input data. Therefore, it is possible to solve the problem such as the lack of transmission margin due to a rapid change of the level when the level of an input data changes during transmission.

Figure 5A:
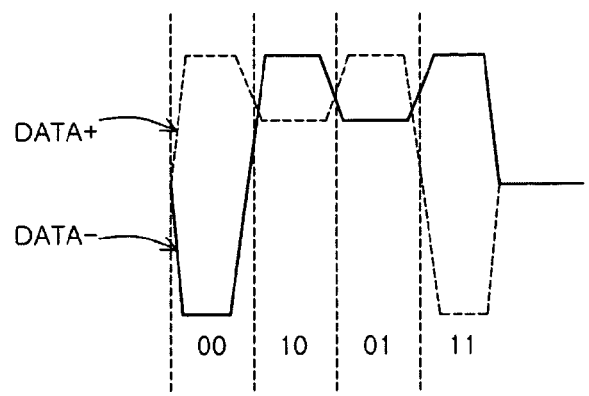
FIGS. 5A and 5B are waveform diagrams illustrating a 4PAM signaling scheme that can be implemented by the receiver circuit of FIG. 1.
Figure 5B:
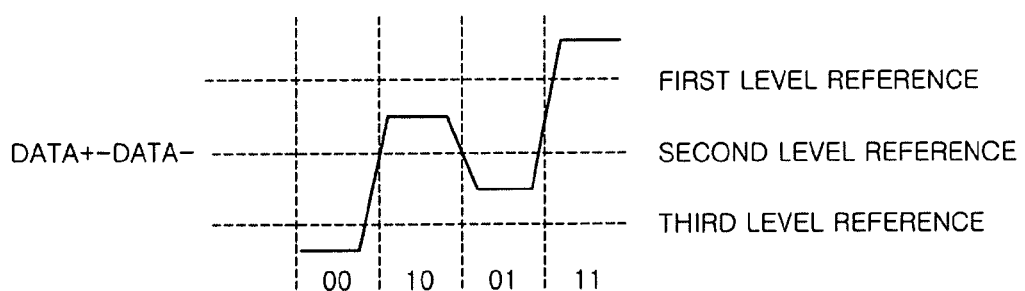

FIGS. 5A and 5B are views showing waveforms that can show various data input methods. FIG. 5A shows input data signals "Data+" and "Data−" in four states, i.e. 00, 01, 10, and 11, according to the magnitude of voltages, and FIG. 5B shows input data according to voltage differences of the input data "Data+ and "Data−", i.e. in the differential approach.

The receiver according to an embodiment described herein can transmit data without generating distortion by transmitting the above-mentioned input data. Further, since the receiver is simply accomplished using MOS capacitors, it can be easily applied to any circuit while decreasing a circuit area. Therefore, such a receiver circuit can transmit data at every 90° clock phase difference and transmit data at a high speed. Further, the 4-phase configuration is exemplified in the invention, but the number of phases (clock) is not limited thereto.

Such a receiver circuit can be applied to various fields, such as all of the fields of high-speed data transmission systems, memories, CPUs, and ASICs. Further, such a receiver circuit can detect signals on the basis of four clocks having different phases, but the number of clocks is not limited thereto.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A receiver circuit comprising:
    a first phase transmission unit that is synchronized with a first clock, detects input data according to a plurality of threshold detection levels, and transmits a first output signal;
    a second phase transmission unit coupled with the first phase transmission unit, the second phase transmission unit synchronized with a second clock and configured to detect the input data according to an output of a first discharging control unit, and transmits a second output signal; and
    the first discharging control unit coupled with the second phase transmission unit, the discharge control unit configured to control the second phase transmission unit in response to the first output signal and adjust the transmission speed of the second phase transmission unit by changing a node potential where an output of the second phase transmission is determined.

2. The receiver circuit of claim 1, wherein the first discharging control unit is further configured to increase the data sensing speed of the second phase transmission unit when input data that is received when the first clock is enabled is different from input data that is received when the second clock is enabled.

3. The receiver circuit of claim 1, wherein the first discharging control unit comprises a capacitor that is connected between the output of the first phase transmission unit and the node of the second phase transmission unit.

4. The receiver circuit of claim 3, wherein the capacitor is a Metal Oxide Semiconductor (MOS) transistor type capacitor.

5. The receiver circuit of claim 4, wherein the MOS transistor type capacitor comprises an N-channel Metal Oxide Semiconductor (NMOS) transistor of which a gate is connected with the node of the second phase transmission unit, and a drain and a source are connected with a node where the first output signal is received.

6. The receiver circuit of claim 1, wherein the first phase transmission unit comprises:
    a first level detection unit that outputs a first detection signal of the first output signal by detecting and amplifying a signal above a first threshold level in the input data;
    a second level detection unit that outputs a second detection signal of the first output signal by detecting and amplifying a signal above a second threshold level in the input data; and
    a first coding unit that receives and codes an output of the first level detection unit and an output of the second level detection unit, and then outputs a first phase output signal.

7. The receiver circuit of claim 6, wherein the first discharging control unit comprises:
    a first capacitor unit that is connected with an output terminal of the first level detection unit and a first node of the second phase transmission unit and changes the potential of the first node according to an output of the first level detection unit; and
    a second capacitor unit that is connected with an output terminal of the second level detection unit and a second node of the second phase transmission unit and changes the potential of the second node according to an output of the second level detection unit.

8. The receiver circuit of claim 7, wherein the second phase transmission unit comprises:
    a third level detection unit that outputs a third detection signal of the second output signal by detecting and amplifying a signal above a third threshold level in the input data according to an output of the first capacitor unit;
    a fourth level detection unit that outputs a fourth detection signal of the second output signal by detecting and amplifying a signal above a fourth threshold level in the input data according to an output of the second capacitor unit; and
    a second coding unit that receives and codes an output of the third level detection and an output of the fourth level detection unit, and then outputs a second phase output signal.

9. The receiver circuit of claim 7, wherein the first capacitor unit operates as a capacitor when an output of the first level detection is at a low level.

10. The receiver circuit of claim 7, wherein the first level detection unit comprises:
    a first sense amplifier that detects and amplifies a signal above the first threshold level in the input data; and
    a latch unit that receives and latches the first detection signal, and then transmits the latched signal to the first coding unit.

11. The receiver circuit of claim 10, wherein the sense amplifier comprises:
    an input comparing part that receives the input data and adjusts the potentials of the first node and the second node; and
    an amplifying part that amplifies the first output signal according to the potentials of the first node and the second node.

12. The receiver circuit of claim 1, further comprising:
    a second discharging control unit that adjusts the transmission speed of a third phase transmission unit by changing the node potential of the third phase transmission unit according to the second output signal; and
    the third phase transmission unit that is synchronized with a third clock, detects the input data according to an output of the second discharging control unit, and transmits a third output signal.

13. The receiver circuit of claim 12, further comprising:
    a third discharging control unit that adjusts the transmission speed of a fourth phase transmission unit by changing the node potential of the fourth phase transmission unit according to the third output signal.

* * * * *